United States Patent

[11] 3,611,355

[72] Inventor David H. Hartke
Monterey Park

[21] Appl. No. 848,209
[22] Filed Aug. 7, 1969
[45] Patented Oct. 5, 1971
[73] Assignees Ralph D. Hasenbalg
Thousand Oaks, both of, Calif.;
Xerox Corporation
Stamford, Conn.

[54] ANALOG-TO-DIGITAL CONVERTER
6 Claims, 1 Drawing Fig.

[52] U.S. Cl. .......... 340/347 AD
[51] Int. Cl. .......... H03k 13/02
[50] Field of Search .......... 340/347

[56] References Cited

UNITED STATES PATENTS

| | | | |
|---|---|---|---|
| 3,384,889 | 5/1968 | Lucus | 340/347 |
| 3,298,014 | 1/1967 | Stephenson | 340/347 |
| 3,286,253 | 11/1966 | Leng | 340/347 |

*Primary Examiner*—Maynard R. Wilbur
*Assistant Examiner*—Jeremiah Glassman
*Attorney*—Smyth, Roston & Pavitt

ABSTRACT: An analog-to-digital converter is disclosed in which analog signals are serially digitized at resolution less than required, and an amplified analog error signal is formed from the difference of the initial digital signal and the analog input and summed with the initial digital signal to provide a high-resolution digital equivalent.

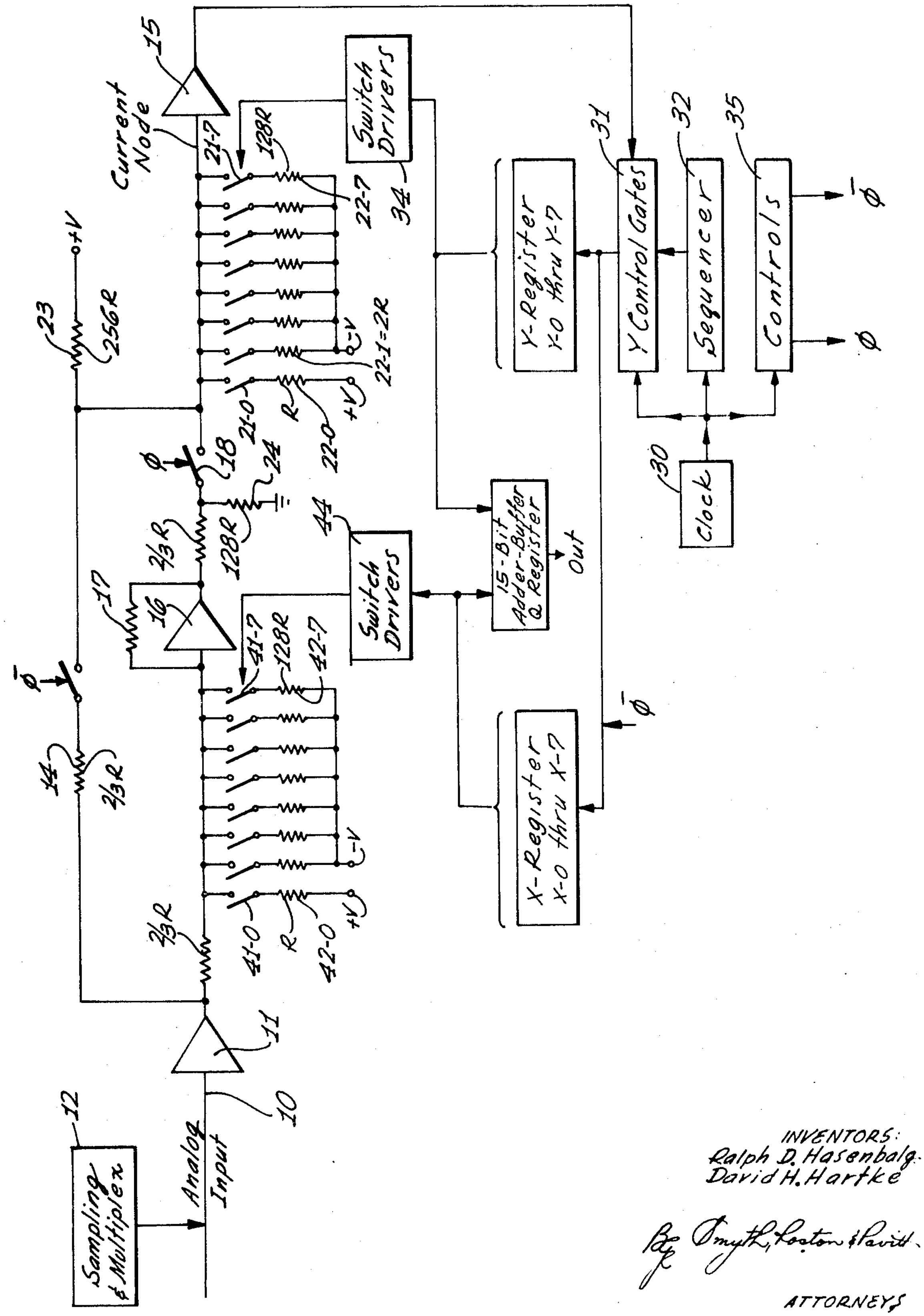
INVENTORS:
Ralph D. Hasenbalg
David H. Hartke
By Smyth, Roston & Pavitt
ATTORNEYS

ANALOG-TO-DIGITAL CONVERTER

The present invention relates to an analog-to-digital converter. Analog-to-digital converters can usually be classified in groups. One group includes high-speed parallel converters in which the several digital bits are formed more or less simultaneously. The high speed of operation is obtained here at significant expenditures. The converters of the second group operate by successive approximation; progressively synthesized analog equivalents of progressively formed digital signals are compared individually with the analog information signal. Each comparing step, in turn, produces one or two digital bits to be added to the digital signal. The information signal is regarded as digitized when the synthesized analog equivalent differs from the information signal by a value below the desired resolution. Converters of the second group are both considerably slower and less expensive than converters of the first group. It is an object of the present invention to increase speed and to improve noise rejection of converters of the second group.

Employment of a parallel or of a serial approximation-type converter may often be dictated by the expected rate of change of the analog signal to be digitized. Digitization of a variable analog signal requires always sequential sampling of the analog signal at discrete intervals. Each sampled analog signal value is digitized separately and must be held for the period of digitization. Variations of the analog signal within that period escape detection. Therefore, the period of digitization must be sufficiently short so that significant variations, for example, in form of a signal peak or valley at an amplitude exceeding the resolution do not occur in between two sequential samplings. Signal variations during successive sampling periods reflect the upper end of the frequency range and bandwidth of the analog signal, so that the desired frequency range and bandwidth dictate the sampling rate, which, in turn, determines the slowest still permissible conversion speed.

In cases where bandwidth and frequency range of the analog signal are given parameters and constitute part of system's specification, a speedup of the serial approximation process, if possible, and with little expenditure may dispense with the requirement of employing a costly parallel converter. The invention provides for such a speedup. The conversion, in accordance with the preferred embodiment of the invention, takes place in a plurality of phases, for example, two major phases. During the first phase the analog signal is serially digitized at a low-resolution conversion process, thus expressing the analog signal on a rather coarse scale, with less digits than ultimately required. Subsequently, an analog error signal, or residual signal, between the exact analog equivalent of this first order digital signal as produced during this first phase and the analog information signal, is formed and digitized during the second phase. At the end of the second phase the low-resolution digital signal of the first phase is digitally combined with the high-resolution, digitized error signal to form the final high-resolution output signal of the conversion process. Preferably, the first phase and the second phase produce similar numbers of digits so that each of the two phases produces about half the digits required.

The error signal digitization could again be carried out in several phases, so that several digital signals are finally combined. However, it would serve no purpose to use too many phases as the arithmetical combining requires likewise time and more involved circuitry. Using too many phases does not improve speed but cost approaches cost of a parallel converter. Thus, the number of digits produced during this phase should be more than a few. In particular, in order to obtain the desired result, namely, speed reduction, without incurring expenses comparable with parallel converters, it is necessary that the total number of phases be significantly smaller than the total number of bits; particularly the number of phases should not exceed the number of bits formed per phase. If this rule is observed, a significant speed improvement can be obtained and total expenditure remains comparable with a straightforward serial converter.

Each digitization phase is carried out as serial approximation and at a lesser resolution than required as a whole. As a consequence, each approximation step within each digitization phase can be carried out considerably more rapidly than possible if each approximation step had to be carried out at the accuracy equal to the overall final resolution. This involves particularly the comparator forming at any instant the difference between synthesized analog equivalent of the digital signal as produced thus far, and the analog information signal.

In case a 15-bit resolution is required, a straightforward serial approximation has to be carried out at a resolution for each step as ultimately required. If, on the other hand, the digitization is carried out in two phases with an 8-bit resolution for each phase, the (additional bit being the sign bit of the second phase of error digitization), then the accuracy for each approximation step needs to reflect the 8-bit resolution only. In general, the first, coarse approximation needs to be as accurate only as subsequent error or residue digitization can correct.

The resolution requirement is reflected in the settling time for the formation of the difference of analog information signal and of synthesized analog equivalent of the digital signal as formed thus far at the decision-making comparator in the digitizer. The settling time of the comparator is the time from formation of the difference and the time when detecting the sign of the difference. This settling is about one-third the period if for each step an eight bit instead of a 15-bit resolution is used. The fact that an additional bit has to be formed, and that there is an arithmetic process involved for combining the two eight bit numbers, has negligible consequences as far as extending the process is concerned.

It should be mentioned that subdividing the process into three phases would produce some further reduction for the settling time for each comparing step, but another bit would have to be added and another addition has to be performed. This requires additional circuitry for the two additions including storage facilities for the sign bit. One can readily see that when the number of phases approximately equals the number of digitization steps per phase, no saving in time is actually gained, and the circuitry involved is extensive.

The total number of comparing steps, when carried out in two phases, is one more than in case of a straightforward approximation, but the approximation step sequence takes about one-third of the time, and the sampling rate of analog signals to be digitized can be increased accordingly. Thus, the new converter may well be usable, where before a parallel converter had to be employed. On the other hand, for a given conversion time and sampling rate permitting straightforward serial approximation, the comparator can have a considerably narrower bandwidth, around the approximation frequency, which is very advantageous for noise rejection.

While the specification concludes with claims particularly pointing out and distinctly claiming the subject matter which is regarded as the invention, it is believed that the invention, the objects and features of the invention and further objects, features, and advantages thereof will be better understood from the following description taken in connection with the accompanying drawings, in which:

The FIGURE illustrates a block diagram, partially as circuit diagram, of the preferred embodiment of the invention, showing particularly a two-phase analog-to-digital converter. In the drawings, an information analog signal is provided in a line 10 and passed to a buffer amplifier 11 to raise the signal to a more suitable level. The analog signal may be developed in line 10 as a consequence of operation of a sampling and multiplexing network 12, coupling line 10, at any instant, to one of a plurality of analog signal sources for a particular period of time. The amplifier 11 will include a "hold" circuit to hold sampled analog signals for the period required for digitization. It is presumed that the analog signal varies very little within that period, preferably less than the accuracy of the system.

The analog signal is to be digitized by using, for example, a format of 15 bits or 14 data bits plus sign bit and in a straightforward binary code. Therefore, the accuracy required is $1:2^{115}$ with reference to full scale value. As was mentioned above, digitization is carried out in two phases, each phase comprising a sequence of steps executed as if conversion were carried out straightforward serially, but at a resolution of less than 15 bits. The several circuit elements will be described essentially in sequence of digitizing a particular analog signal.

The system is under control of a master clock or oscillator 30, controlling the timing and phasing control 40 of the system. The multiplexer 12 may be controlled through the circuit 35. The circuit 35 provides, for example, two phase signals $\Phi$ and $\bar{\Phi}$, in representation of the two phases for each complete digitization. At first a switch 13 is closed by the signal $\bar{\Phi}$ to remain closed during this first phase of the analog-to-digital conversion. The output of sample-and-hold amplifier 11 is thus applied through a resistor 14 to the input current node of a comparator amplifier 15. The analog signal of amplifier 11 is compared at the current node input of amplifier 15 with a synthesized analog signal value derived from a digital-to-analog conversion system 20, also called Y-ladder.

The digital-to-analog converter 20 includes a switching network 21 which is comprised of eight switches 21–0, 21–1 through 21–7. These switches are symbolically shown as contact blades but in reality they are electronic switches, such as field effect transistors (FETs), preferred here for reasons of speed and low noise. The switches 21–1 through 21–7 respectively and individually connect a negative voltage source −V to the input of amplifier 15, respectively through resistors 21–1 through 21–7. The voltage −V of the source is the negative equivalent to full scale analog input. The switch 21–0 connects a source for a voltage +V to the input current node of comparator 15 through a resistor 22–0.

The resistors 22–0 through 22–7 have values related to each other on a binary scale, so that the currents respectively applied through them to the input current node of amplifier 15 have binary digital equivalent significance. The resistance of resistor 22–0 is assumed to be R, the resistor 22–1 then has a resistance 2R, the resistance of the resistor 22–2 is 4R, etc., and the resistance of resistor 22–7 is 128R. Therefore, the highest negative analog value current which can be applied to comparator 15 by network 20 is equivalent to full scale value minus $\frac{1}{2}^{7}$ of the full scale value equivalent. A negative current representative thereof will be applied to the input of comparator 15 when all switches 21, except switch 21–0, are closed. Conversion of the highest positive analog value which can be applied by network 20 to amplifier 15 is equivalent to full scale signal value with switch 21–0 being closed and switches 21–1 through 21–7 being open.

Depending now upon the opening and closing of switches 21–0 through 21–7, an analog value is synthesized by digital-to-analog converter 20, applied to the input of amplifier 15 and added to or subtracted from the signal concurrently applied to comparator 15 by the output of amplifier 11. The positive analog equivalent of the least significant bit is represented by a current when all switches 21 are closed and is likewise equal to $\frac{1}{2}^{7}$ full scale value. The negative analog equivalent of the least significant bit on the 8 bit scale or format is represented by current flow into the input node of comparator 15 for a closed state of switch 21–7, all other switches on network 21 being open, which is a signal equivalent to $\frac{1}{2}^{7}$ full scale value.

A resistor 23 having value 256R is permanently connected to the input current node of comparator 15, and to the positive voltage source +V, in order to center comparator decisions about a value equal to half the bit value of the least equivalent bit of the Y-ladder. The input provided through resistor 23 is one-half of the incremental current, as provided through resistor 22–7 as equivalent for the least significant bit of this 8 bit system.

The amplifier comparator 15 is designed to provide outputs having significance as logic signal. It may be assumed that the comparator turns "true" if the net input current is negative, while the comparator turns "false" if the input current is positive. Considering the particular zero shift as provided through the resistor 23, the comparator will turn true if the signal current as provided by digital-to-analog converter 20 combined with the output of amplifier 11 is more negative than a current value representing one-half of the least significant bit, which is equal to a ninth bit equivalent current and is provided through the resistor 23; the comparator will turn false if the signal current from sources 20 and 11 to the input of comparator 15 is more positive than a current representing minus one-half of that least significant bit of the eight bit converter system 20.

The switches 21–0 through 21–7 are under control of a switch driver circuit 34 constructed to individually open and close the eight switches and respectively in dependence upon the state of the eight stages of a Y-register. It may be assumed that a set state of a stage of the Y-register corresponds to an open state of the respectively associated switch. In other words, the driver circuit 34, for example, closes in switch 21–0 if the stage Y–0 of the Y-register is set; if stage Y–0 is reset the switch 21–0 stays open. The situation is similar for the other stages of the Y-register as associated with the other switches. The ultimate set and reset state of the various stages of the Y-register is determined by a control gate circuit 31 which, in turn, is under control of a sequencer 32 of the output of amplifier 15 and of the clock pulses from clock 30.

Details of straightforward serial analog-to-digital conversion is not the immediate subject matter of the present invention and can therefore be dealt with rather summarily. The sequencer 32, in particular, also is under control of clock 30 which determines the rate of digitization. The sequencer is, for example, a shift register or binary counter and has eight output lines. In response to the clock pulses of source 30, sequencer 32 provides enabling signals to these output lines, one at a time, and in a predetermined sequence. These output lines enable the input control 31 for the eight stages of the Y-register to determine their state. The Y-register input gating 31 is constructed so that the sequencer enables, at any instant, the reset input of one stage of the Y-register and the set input of the next higher stage, (except that initially it is the set input of Y–0 which is enabled concurrently with the set input of Y–1). The next clock (falling edge) always sets this next higher Y-stage, while the reset enabled stage is reset through the clock only if comparator 15 provides a true signal at that instant. The same clock pulse advances the sequencer.

It is assumed that initially, i.e., at the beginning of the first phase of operation of digitization, all stages of the Y-register are in the reset state and, accordingly, all switches 21 are open. An analog information signal is applied by hold amplifier 11 to the input current node of comparator 15. The input for the comparator then effective, is the combination of the analog information signal current, positive or negative, combined with a positive current, from and through register 23.

The first clock pulse during this first phase enables the particular gates of network 31 governing the stage Y–0 of the Y-register. If the analog information input current is more positive than the negative current, as provided through zero shift resistor 23, then the effective input for comparator 15 is positive, and the output of the comparator turns false. The input circuit 31 for the Y-register is constructed that its stage Y–0 remains reset for this case. If the total signal current in the current input node of comparator 15 is negative, i.e., if the analog information is more negative than the ninth bit equivalent, then the comparator turns true, and at the end of the first clock pulse, stage Y–0 of the Y-register is being set.

Therefore, at the end of the first clock pulse period within this first phase of digitization, the state of stage Y–0 and of switch 21–0 is determined by the sign of the analog information input as modified by the zero shift bias. A sign error can occur only if the input signal is so small that during the first phase of digitization all data bits will be zero. The sign error will then be corrected after the second phase. Any analog information signals having values sufficiently high so that during this first, coarse phase of digitization at least one of the first seven data bits (excluding sign bit) will obtain a value equal to 1, leads to a correct sign bit at the end of the first clock pulse.

The falling edge of the first clock pulse also sets stage Y–1 of the Y-register, whereupon switch 21–1 closes so that at the end of the first clock pulse period, a negative current equal to one-half of the full scale equivalent is applied to the input of comparator 15 through resistor 22–1, with or without concurrent application of positive current through resistor 22–0, depending upon the sign of the analog information signal. That first falling edge of the first clock pulse also shifts sequencer 32 to the next state so that reset input for stage Y–1 and set input for stage Y–2 are prepared. Comparator 15 must settle up to the time of the falling edge of the second clock pulse so that the comparator provides a true or false signal to the gate control 31 at that time.

Now, depending upon the state of comparator 15, the falling edge of the second clock pulse will cause the stage Y–1 to reset if the output of amplifier comparator 15 turned true. In this case switch 21–1 is opened again. If the comparator output was false, stage Y–1 remains set, and switch 21–1 remains closed.

The falling edge of the second clock pulse also sets stage Y–2, causing switch 21–2 to close through the appropriate driver of the circuit 34. A new synthesized analog signal becomes thus effective at the input of comparator 15, and another decision is made concerning the final state of switch 21–2. Thus, one can see that upon progression of sequencer 32 under control of the clock, one of the stages of the Y-register is set and the one of next higher order stays set or is reset as a consequence of the current balance in the input node of comparator 15 and of the resulting state of the comparator at that time.

One can therefore see that a digital signal is built up in the Y-register, progressing from the sign bit to the most significant data bit of given sign to lower significant digits towards the eighth bit which is the seventh data bit. The individual digits are produced as a result of comparing the existing analog value with a synthesized one as progressively built up through the cooperation of the content of the Y-register and the state of switches 21. Particularly, the synthesized analog signals are developed progressively in a stepladder approach to approximate the analog information signal as derived from amplifier 11 at an accuracy determined by the 8-bit resolution capability of the Y-register.

As an example, it may be assumed that the analog output of amplifier 11 is equal to +V/2. During the first interrogation cycle or clock pulse period, the output of comparator 15 turns false so that the most significant stage of the Y-register remains set and switch 21–0 remains open. Concurrently, switch 21–1 closes. At the end of the second clock pulse period the comparator 15 continues to provide a false output, as the input current is still positive. Therefore, the stage Y–1 is not reset and switch 21–1 stays closed accordingly. At that same falling edge of the second clock pulse, stage Y–2 is set and switch 21–2 closes.

In accordance with the assumed analog information signal value, as being equal to +V/2, the input of the comparator will turn negative and the output of comparator 15 turns true accordingly. This means that at the falling edge of the third clock pulse stage Y–2 is reset and switch 21–2 will open. The process continues in that at the time of each edge of a clock pulse the respective next Y-stage is set causing the input current of amplifier 15 to go negative; the output thereof turns true and the stage is reset again. At the end of phase 1, stage Y–0 is in the reset state in accordance with a positive sign bit; stage Y–1 is in the set state, all other stages of the Y-register are in the reset state.

If the analog information signal is assumed to be slightly below V/2, by a value which is more than V/256, then at the end of the second clock pulse period stage Y–1 is also in the reset state and switch 21–1 reopens again, but during all of the succeeding comparing processes, the output of comparator 15 will remain false and accordingly switches 21–2 through 21–7 will remain closed.

At the end of the first approximation phase, which is precisely after the eighth clock pulse, the state of the Y-register is copied into the eight stages of an X-register, in stage-by-stage copying association, as far as the Y-register is concerned. For reasons of permitting separate processing of the content of the X- and Y- registers subsequently, as will be described below, it is advisable to transfer or copy the content of the Y-register to the X-register at the end of that first phase, i.e., after the analog information input has been coarsely digitized in the 8 bit format, as described.

Alternatively, of course, it is possible that already during the first phase of operation control gate 31 and sequencer 32 control corresponding stages of the Y-register and of the X-register directly in parallel operation, so that bit-value-corresponding stages for the X- and Y-registers assume similar states. In either case, a corresponding set of eight switch drivers 44 respectively responds to the states of the eight stages of the X-register to operate a second set 41 of switches 41–0 through 41–7. These switches pertain to a second digital-to-analog converter 40 operated to apply the same synthesized analog signal to the input of an amplifier 16, in the following also called "error" or "residue" amplifier.

The second digital-to-analog converter 40 includes a resistor network 42 analogous to network 22 and including resistors 42–0 through 42–7 which on an individual basis are a duplicate set of the resistors 22–0 through 22–7 respectively. The connection to biasing sources +V and −V is likewise similar. Therefore, the synthesized analog signal applied by digital-to-analog converter 40 to the input current node of comparator 16 is the same as provided by network 20 to the input of comparator 15, except that there is no zero shift offset, i.e., there is no equivalent biasing circuit, such as resistor 23, for the input circuit of amplifier 16.

At the end of the first phase as the latest, a residue or error amplifier 16 receives at its input current node the coarsely (eight bit) digitized analog equivalent of the information analog signal and the information signal itself but at opposite signs. The input of amplifier 16 is particularly connected to the output of sample-and-hold amplifier 11 through a resistor 19 having value R. The resulting analog signal as applied to the input of amplifier 16 is thus equal to difference between the analog information signal to be digitized and the analog equivalent of the 8 bit digitization produced in the first phase. The input of amplifier 16 is, therefore, a true error signal representing the difference between the coarse and the desired final resolution in analog form. The error produced during the first phase may be considered now in some greater detail.

At the last digitizing step of the first phase a decision was made whether or not the eighth bit (negative current through resistor 22–7) as now duplicated by a negative current through resistor 41–7) had to be added to the digitized signal or not. If the bit was not added, the output of comparator 15 turned true. It seems then that an error between zero and up to the full analog equivalent value of the eighth bit were possible if biasing resistor 33 was not provided. This bias, however, introduces a digital zero shift, unidirectionally and by half the analog equivalent value of the eighth bit. Therefore, the residual error will have an analog equivalent value of at most, plus or minus one-half of the eighth bit value. It is for this reason that resistor 23 has to be provided for in order to make sure that the residue error can be positive or negative having amplitude at either polarity of at most equal to the ninth bit analog equivalent, which is the eighth data bit equivalent, having value V256.

Amplifier 16 has a high gain and is provided with a feedback resistor 17 to establish an inverting, operational amplifier. The resistor 17 has a value equal to $2^7$R or 128R so that this amplifier arrangement provides amplification of the error signal by a factor of 128. As a consequence the amplifier 16 has a full scale output value which is equivalent to plus-minus 128 times one-half of the bit value of the bit of eighth significant after the first phase digitization. This residue is digitized during the second phase. The most significant bit of the second phase digitization will be a sign bit having bit position value equal to the eighth bit of the first phase as now represented by the state of switch 41–7. The second most significant bit of the digitized error signal will have the equivalent of at most one-half (plus-minus) of the correction needed to correct the digital representation as was provided pursuant to the first phase. That error signal, amplified by 128, is now digitized in exactly the same manner as described before and during the second phase of the digitization process. For this second digitization process, of course, switch 18 is closed by phase signal Φ, which turned true at the end of the ninth clock pulse, counting from the beginning of the first phase. Switch 13 is opened to separate the input current node of comparator 15 from sample-and-hold amplifier 11.

The system proceeds now through the second phase of the digitization process. The Y-register is reset with the 10th clock pulse and the driver 34 opens all the switches 21 accordingly. During the second digitization phase, sequencer 32 will run through the same sequence just as if a second analog signal has to be digitized. It will be observed, however, that during digitization of the residue or error, an additional biasing resistor 24, having value 128R, connects the negative voltage source −V to the input circuit of comparator 15. As a consequence and through cooperation of resistors 23 and 24, as respectively connected to voltage sources of opposite polarity, and because their resistance values are related at a ratio of 2:1, the current balance as introduced by them has a negative sign and a value equivalent to a ninth bit as to the second digitization process, or a 16 th bit equivalent when referenced against the analog information proper and under consideration of the $2^{7}$ amplification provided by residue amplifier 16. As a consequence of this bias, the final 15 bit digital has an error having value of at most a 16 th bit equivalent and being always of one particular sign.

Upon completion of the second phase, the Y-register holds seven data bits and one sign bit corresponding to the digitized error as between analog information and the eight bit digital signal produced during the first phase. Depending upon the relation between the sign bits held in stages X–O and Y–O, the content of the X- and Y-Registers must now be particularly combined in order to form the 15 bit digital number as desired.

There are available at this point two digital numbers, each having eight bits and held respectively in the X- and Y-register. Let H be the input to the system as provided by amplifier 11, and let X and Y respectively denote the analog equivalents of the digital signal held in the X- and Y-registers, then after the time of the second digitization, the current input node of comparator 15 has achieved balance within the resolution capability of Y so that the following relation is true: $Y=-128\,(H-X)-1$, wherein −128 represents the gain of the residual amplifier, and $H-X$ is the current difference represented at the current input node of amplifier 16. −1 represents a subtraction of the least significant bit as provided through the resistor 24.

Restating the equation produces $H=X+-Y-1/128$. Since a negative number in two's complement form is equal to the one's complement of the same number plus 1, it is true that $-Y-1=<\nu^{Y}$. Therefore, the above equation can be written to state $H=X+\overline{Y}/128$. This equation tells us how to combine the content of the X- and Y-registers in order to obtain the full digitized number as equivalent to the analog signal H. The complement of all stages of the Y-register has to be formed, and the content of the X- and Y-registers have to be added after a division of the content of the Y-register by 128. A division by 128 is the equivalent of a shift of the content of the Y-register relative to the X-register by seven steps in direction of lower digital significance. This means, in effect, that the content of register Y (after conversion) of the stages Y–1 through Y–7 are simply concatenated to the content of the X-register.

The content of the stage Y–0, defining the sign bit of the residual is treated as a carry, which may or may not propagate into the X-register. If stage Y–O holds a zero bit, no carry propagates into the X-register so that the content of stages Y–1 through Y–7 (each holding the inverted bit as was produced during the second phase) is simply concatenated with the X-bits at the low end thereof. When stage Y–O holds a one bit, the content of the X-register must be modified to form bits Q in accordance with the relation $Q_i=X_i+1+X_{i+1}$ where index $i$ has values $i=0$ through 7, $x_8=0$. The carry bit as formed may thus propagate into the contents of the X-register. For this purpose an adder is provided as a 15 bit output buffer, register, also called Q-register.

It can readily be seen that the invention can also be constructed as a simplified parallel converter. The analog information signal is digitized in parallel, but again with less stages than are required in case of straight-forward parallel conversion for the desired resolution. At first a coarse value is obtained. The analog equivalent of that coarse value is then referenced against the analog signal and the resulting error signal is amplified. The amplified error signal is in-parallel digitized, and the two resulting digital signals are arithmetically combined amounting to a mere or partial concatenation of lower-to-higher significant bit values of the two digitized signals.

The system as described has these advantages. The speed of the individual approximation steps during each digitization phase is determined by the settling time at the input of comparator 15 measured in between the formation of a differential as between synthesized analog signal and the output of hold amplifier 11, after a switch of the switches 21 has closed. The output of amplifier 15 determines the final state of the stage of the Y-register as a result of that comparison. The settling time for each of these comparing steps is determined by the required accuracy. For conversion of an analog signal to an eight bit digital signal, the settling time is determined for the time it takes until the input has settled to below $1:2^{17}$full scale value. Settling time is significantly longer in case one would operate with full scale 15 bit equivalent accuracy for each comparing step, where the input has settled to below $1:2^{15}$ The settling time would approximately be three times as long. On the other hand, for a given conversion speed, the two-phase eight bit conversion requires bandwidth for comparator 15 which is significantly narrower than the bandwidth for an amplifier when comparing at a full 15 bit resolution. A narrower bandwidth provides a correspondingly higher noise rejection capability for the system.

The invention is not limited to the embodiments described above, but all changes and modifications thereof not constituting departures from the spirit and scope of the invention are intended to be covered by the following claims.

I claim:

1. An analog-to-digital converter for providing a digital signal at an N-bit resolution, comprising:

first means for digitizing analog signals at an M-bit resolution, M being approximately equal to N/2 and including a digital-to-analog converter for providing the analog equivalent thereof;

second means for storing M-bit digital signals as digitized by the first means;

third means connected for receiving analog signals to be digitized and further connected to the second means to provide an error signal as the difference between the analog equivalent of the digital signal generated by the first and stored by the second means and an analog signal received directly by the third means and including means to store representation of the sign of the error signal; signal means connected to the third means for amplifying the error signal by a factor corresponding to a factor in the order of $2^{M}$;

fourth means for sequentially connecting the first means to receive a digitized analog signal, bypassing the signal means, and to store the resulting digital signal in the second means and to subsequently cause the first means to receive the resulting amplified error signal from the signal means, for the first means to digitize said amplified error signal, and means connected to be responsive to the sign representation for arithmetically combining the content of the second means and of the digitized error signal to obtain an N-bit digital number.

2. An analog-to-digital converter comprising:

first means for digitizing analog signals at an M-bit resolution;

second means for forming the amplified difference between an analog information signal and the analog equivalent of an M-bit digital signal as formed by the first means by a factor equivalent to the M-bit resolution and the corresponding scale factor;

third means connected to the first and second means for sequentially operating the first and second means and including means for applying in P-steps, P not exceeding M, respectively residual signals formed from the analog information signal and the analog equivalent of digital residual signals formed in previous steps by the first means, the residual signal digitized by the first means during the first step being the unamplified analog information signal itself; and fourth means for arithmetically combining the digital signals as sequentially formed by the first means under control of the third means to provide an N-bit resolution digital equivalent of the analog information signal.

3. An analog-to-digital converter system for converting an analog input signal to a group of digital output signals at an N-bit resolution comprising:

first means for converting an analog input signal to a first resolution group of digital signals and storing said digital signals in a first storage means;

second means for producing an analog error signal equal to the difference between the analog equivalent of the first resolution group of digital signals and the input analog signal, said second means including means for amplifying the analog difference signal by a factor having an order of magnitude substantially equivalent to the absolute value of the first resolution group of digital signals;

third means operating for connecting the means for amplifying to the first means for substituting the analog difference signal for the analog input signal at the input of the first means so as to cause said first means to convert said difference signal and to store a second group of digital signals representative thereof in a second storage means; and fourth means for arithmetically combining said group of digital signals in the first and second storage means.

4. A converter system as in claim 3, the first means including a single comparator and a first resistance ladder operated for progressively building up the analog equivalent upon sequential generation of digit bits, the second means including a second resistance ladder holding a duplicate of the analog equivalent for production of the error signal as the first means converts the amplified error signal into the second group of digital signals.

5. A converter as in claim 1, the first means including a single comparator, the third means including a second digital-to-analog converter for holding a duplicate of the digitized analog signal for the first converter to participate in digitization of the error signal.

6. An analog-to-digital conversion system comprising:

a high-speed serial analog-to-digital converter for providing for digitizing analog signals applied to its input on a low resolution scale and including a digital-to-analog converter for progressive build up of an analog reference signal upon sequential generation of digit bits by the analog-to-digital converter;

a second digital to analog converter responsive to the generated digit bits and providing an analog equivalent signal in representation thereof;

signal means for receiving an analog information signal to be converted into digital signals;

error signal means connected to the signal means and to the second converter to produce an error signal; an amplifier connected to receive the error signal and amplifying same corresponding to the resolution scale of the high-speed converter;

control means operating to connect the signal means directly to the high-speed converter bypassing the amplifier in a first phase of operation, and to connect the amplifier output to the high-speed converter in a second phase of operation, to obtain sequential low-resolution digitization of the analog information and low-resolution digitization of the amplified error signal; and digital means for arithmetically combining the digitized amplified error signals at a reduced position order of the latter, digitized error signals corresponding to a digital elimination of the amplification, for providing a digital output of twice the resolution of the high-speed converter.